(12) United States Patent
Hansen et al.

(10) Patent No.: US 11,993,978 B2
(45) Date of Patent: May 28, 2024

(54) SEAL MECHANISM FOR LOAD PORT DOORS

(71) Applicant: APPLIED MATERIALS, INC., Santa Clara, CA (US)

(72) Inventors: James Christopher Hansen, Sunnyvale, CA (US); Douglas Brian Baumgarten, Round Rock, TX (US); Paul Reuter, Austin, TX (US)

(73) Assignee: Applied Materials, Inc., Santa Clara, CA (US)

(*) Notice: Subject to any disclaimer, the term of this patent is extended or adjusted under 35 U.S.C. 154(b) by 88 days.

(21) Appl. No.: 17/856,576

(22) Filed: Jul. 1, 2022

(65) Prior Publication Data
US 2024/0003181 A1 Jan. 4, 2024

(51) Int. Cl.
*E06B 7/23* (2006.01)
*H01L 21/67* (2006.01)

(52) U.S. Cl.
CPC ...... *E06B 7/2307* (2013.01); *H01L 21/67155* (2013.01)

(58) Field of Classification Search
CPC ......... H01L 21/67775; H01L 21/67766; H01L 21/67772; H01L 21/67155; E06B 7/2307
See application file for complete search history.

(56) References Cited

U.S. PATENT DOCUMENTS 10,453,727 B2 * 10/2019 Bonecutter ....... H01L 21/67775
10,501,271 B2 * 12/2019 Suzuki ............. H01L 21/67201
2005/0274459 A1    12/2005 Tanase et al.
2018/0130687 A1 *  5/2018 Bonecutter ....... H01L 21/67772
2020/0043769 A1 *  2/2020 Bonecutter ....... H01L 21/67775
2020/0168493 A1    5/2020 Sunugatov et al.
2021/0249292 A1 *  8/2021 Sunugatov ........ H01L 21/67259

FOREIGN PATENT DOCUMENTS

WO    2017022432 A1    2/2017
WO    2018089711 A1    5/2018
WO    2022085236 A1    4/2022

OTHER PUBLICATIONS

International Search Report and Written Opinion for International Application No. PCT/US2023/026496, dated Oct. 18, 2023, 9 Pages.

* cited by examiner

*Primary Examiner* — Kaitlin S Joerger
(74) *Attorney, Agent, or Firm* — Lowenstein Sandler LLP

(57) ABSTRACT

The disclosure describes devices and systems for a seal, and methods for using said seal. A seal includes a base portion configured to couple to a groove formed by an edge surface of a first component. The seal further includes a sealing portion extending from the base portion. The sealing portion is configured to create an airtight seal between the first component and a sealing surface of a second component responsive to a threshold sealing force being applied against the sealing portion. The seal further includes a retaining portion substantially perpendicular to the base portion. A surface of the retaining portion is configured to push against the edge surface of the first component responsive to the threshold sealing force being applied against the sealing portion.

20 Claims, 10 Drawing Sheets

SEAL MECHANISM FOR LOAD PORT DOORS

TECHNICAL FIELD

Embodiments of the present disclosure relate, in general, to seal mechanisms for a load port door.

BACKGROUND

An electronic device manufacturing system can include one or more tools or components for transporting and manufacturing substrates. Such tools or components can include a factory interface (e.g., an equipment front-end module (EFEM)) connected to a load lock and/or transfer chamber. In some instances, the front face of the factory interface can include one or more load ports. A load port is a station for the input and output of substrate carriers. The load port can include a frame adapted to connect the load port to a factory interface. The frame can include a transport opening through which one or more substrates are capable of being transported between the substrate carrier and the factory interface.

Current load ports generally don't include seals between the frame of the load port and a load port door. However, such a configuration can be inefficient because current systems do not maintain the environmentally-controlled atmosphere between the frame and the door.

SUMMARY

Some of the embodiments described cover a seal including a base portion configured to couple to a groove formed by an edge surface of a first component. The seal further includes a sealing portion extending from the base portion. The sealing portion is configured to create an airtight seal between the first component and a sealing surface of a second component responsive to a threshold sealing force being applied against the sealing portion. The seal further includes a retaining portion substantially perpendicular to the base portion. A surface of the retaining portion is configured to push against the edge surface of the first component responsive to the threshold sealing force being applied against the sealing portion.

Some of the embodiments described cover a load port door. The load port door includes an interior surface and an exterior surface. The load port door further includes an edge surface including a groove formed in the edge surface. The load port further includes a seal coupled to the groove. The seal includes a base portion configured to couple to the groove and a sealing portion extending from the base portion. The sealing portion is configured to create an airtight seal between the load port door and a sealing surface of a frame of a load port responsive to a threshold sealing force being applied against the sealing portion. The seal further includes a retaining portion substantially perpendicular to the base portion. A surface of the retaining portion is configured to push against the edge surface responsive to the threshold force being applied against the sealing portion.

Some of the embodiments described cover a load port for receiving a substrate carrier. The load port includes a frame adapted for connecting the load port to a factory interface. The frame includes a transport opening through which one or more substrates are transportable between the substrate carrier and the factory interface. The load port further includes a load port door configured to substantially fill the transport opening. The load port door includes an edge surface forming a groove. The load port further includes a seal coupled to the groove formed in the edge surface of the load port door. The seal includes a base portion and a sealing portion extending from the base portion. The seal is coupled to the groove of the load port door via the base portion. The sealing portion is configured to create an airtight seal between the load port door and a sealing surface of the frame responsive to a threshold sealing force being applied against the sealing portion. The seal further includes a retaining portion substantially perpendicular to the base portion. A surface of the retaining portion is configured to push against the edge surface of the load port door responsive to the threshold sealing force being applied against the sealing portion.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1A:
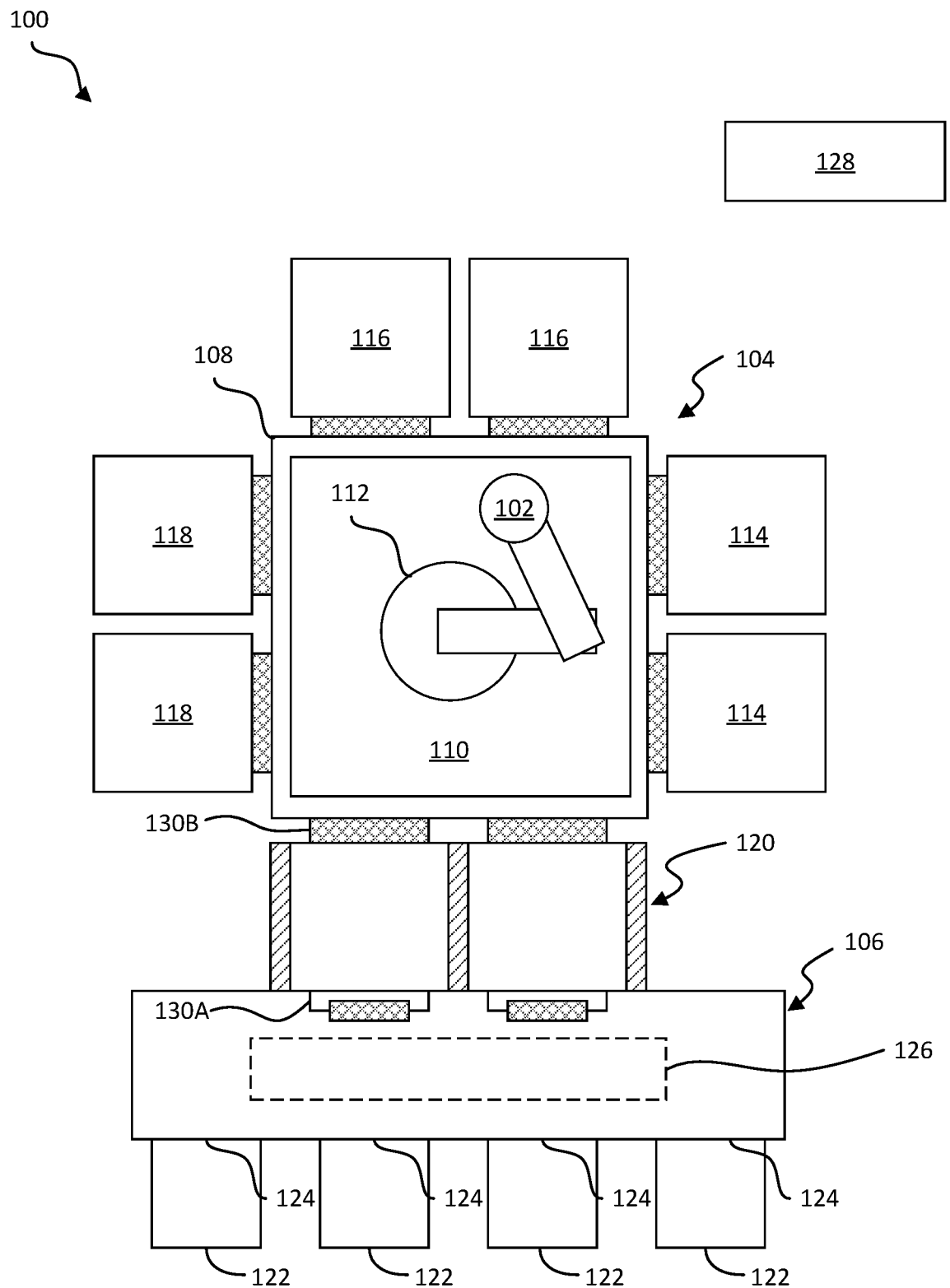
FIG. 1A is a top schematic view of an example electronic device manufacturing system, according to aspects of the present disclosure.

Embodiments described herein cover systems and methods related to seals for load ports. Some embodiments are directed to a seal configured to couple to a load port door. Some embodiments are directed to a load port door having a seal. Some embodiments are directed to a load port including a door having a seal. Other embodiments are directed to seals that can be used for other components of a processing system, such as seals for side storage pods (SSPs), front opening unified pods (FOUPs), and so on. It should be understood that embodiments described herein with regards to seals for load port doors also apply to seals used for any other component, chamber or device in a manufacturing system (e.g., in a semiconductor manufacturing system).

Many conventional load ports do not include a seal between an interface of the load port door and the load port frame. Thus, conventional systems often have leakage around the load port door. A positive pressure can be maintained inside a factory interface (e.g., an EFEM chamber coupled to the load port so that contaminants are not introduced through the interface between the load port door and the load port frame. However, leaking gas can increase a cost of use for a factory interface if such a positive pressure is maintained. Additionally, the leaking gas through the conventionally unsealed interface with a load port door can cause corrosion at the interface which may lead to particle generation. The particles generated can be introduced into both a substrate carrier (e.g., a FOUP) and the factory interface, thereby contaminating the conventional system.

Some conventional load ports can include a traditional o-ring seal (e.g., with a substantially circular cross section) between the load port door and the load port frame. However, these traditional o-ring seals often rely on large forces to create an airtight seal. Often, a load port door actuator cannot provide the large forces relied upon by traditional o-ring seals. As an example, where traditional o-ring seals are used the load port door actuator is to push the load port door against the load port frame such that an o-ring seal disposed between the load port door and the load port frame is sufficiently compressed to create an airtight seal. Including a load port door actuator that can provide sufficient forces for sealing using traditional o-ring seals may contribute to extra expense and weight of the system. Additionally, conventional load port doors often have complex shapes (e.g., such as with a rabbet around an edge of the door) that increases a cost of manufacture of the load port door due to additional use of materials and additional machining performed. Additionally, a traditional o-ring seal often cannot be included because of space constraints. Conventional load port doors that do incorporate a traditional o-ring seal, however, often have a thicker profile to accommodate a machined groove to secure the o-ring seal, adding to the weight and the expense of the door.

In some embodiments of this disclosure, a load port includes a frame adapted to connect the load port to a factory interface. The frame includes a transport opening through which one or more substrates can be transported between a substrate carrier and the factory interface. The load port includes a load port door on the factory interface side of the frame to substantially fill the transport opening when the door is in a closed position. The load port door is coupled to a door mechanism (e.g., an actuator operated by a load port controller). The door mechanism can position the load port door from a closed position to an open position, and vice versa.

The load port door includes a seal having a base portion, a sealing portion, and/or a retaining portion. The seal is configured to couple to a groove of the load port door via the base portion. The groove may be formed by an edge surface of the load port door and may extend around a perimeter of the load port door. The sealing portion of the seal may extend from the base portion. The sealing portion may create an airtight seal against a sealing surface of the load port frame when the door is closed (e.g., by the door mechanism). The sealing portion may create the seal responsive to a force being applied against the sealing portion. The retaining portion of the seal may be substantially perpendicular to the base portion. A surface of the retaining portion may push against the edge surface of the load port door responsive to force being applied against the sealing portion. The retaining portion may cause the base portion of the seal to be retained in the groove of the load port door when a force is applied against the sealing portion.

By providing the seal of the present disclosure, many advances can be realized. For example, the seal of the present disclosure can result in a smaller sealing force to create an airtight seal between the load port door and the load port frame than a sealing force that is used for traditional o-ring seals, reducing the force requirements of the door actuator and allowing the load port frame to be constructed of cheaper materials such as sheet metal. Additionally, the seal of the present disclosure reduces leakage present in conventional systems by sealing the interface between the load port door and the load port frame, thus reducing material consumption (e.g., gas, etc.) and reducing the amount of contaminants that leak out around the load port door when compared to conventional systems. The contaminants may remain in the system and can be exhausted away properly. Furthermore, by including the seal on the load port door, sensing systems (e.g., laser beams, etc.) can detect wafers present in the transport opening of the load port frame without any obstructions from the seal (e.g., the seal is moved away with the door when the door is opened). And, as an additional improvement over conventional seals and systems, the retaining portion of the seal contributes to the seal remaining in its receiving groove on the load port door when forces are applied against the sealing portion of the seal instead of the seal "rolling" out of the groove. Additionally, the retaining portion allows the seal to seat in the groove looser compared to conventional seals, thus improving the installation attributes of the seal, making the seal easier to install while still retaining itself in the groove of the load port door.

Figure 1B:
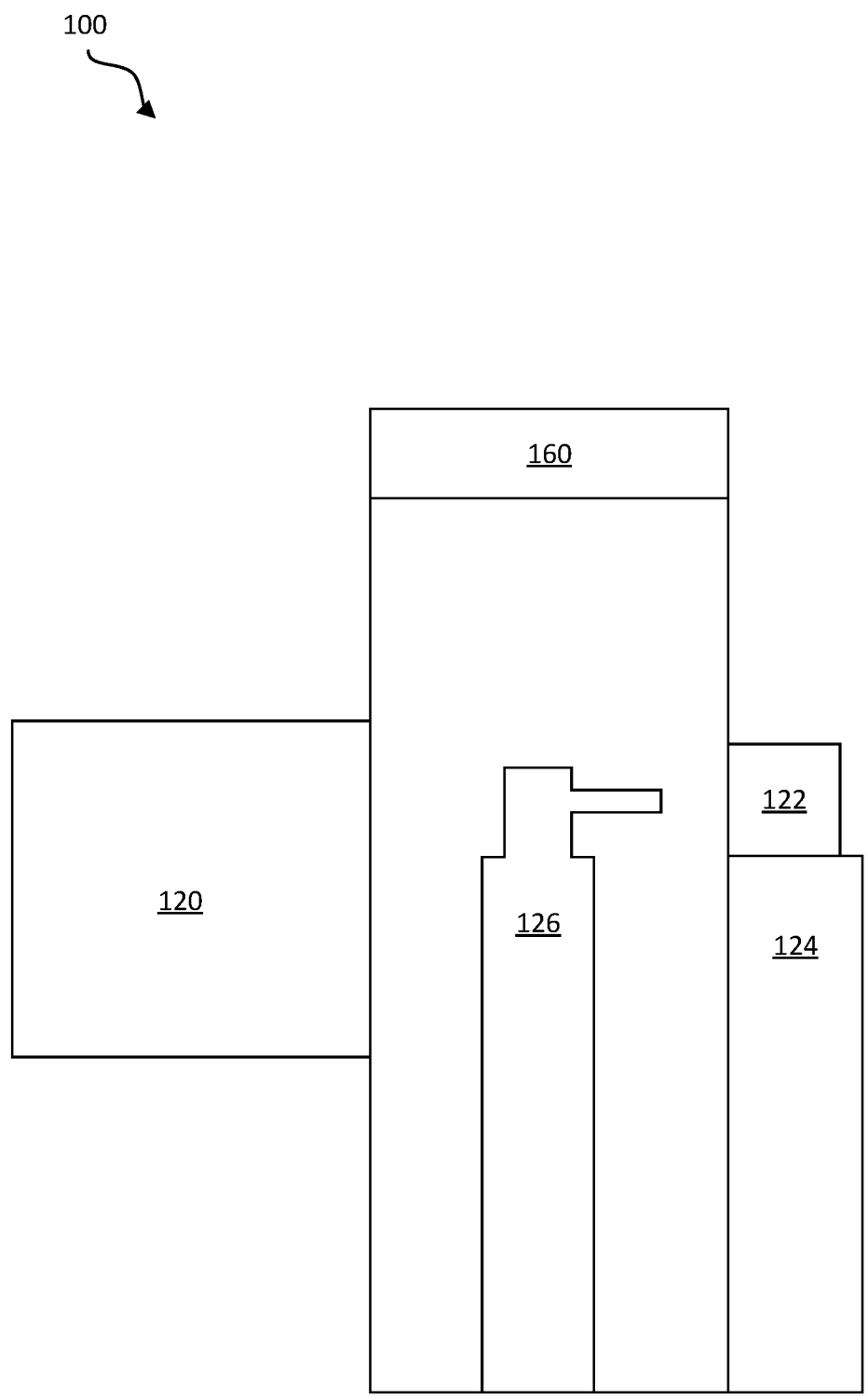
FIG. 1B is a side schematic view of an example electronic device manufacturing system, according to aspects of the present disclosure.
Figure 1C:
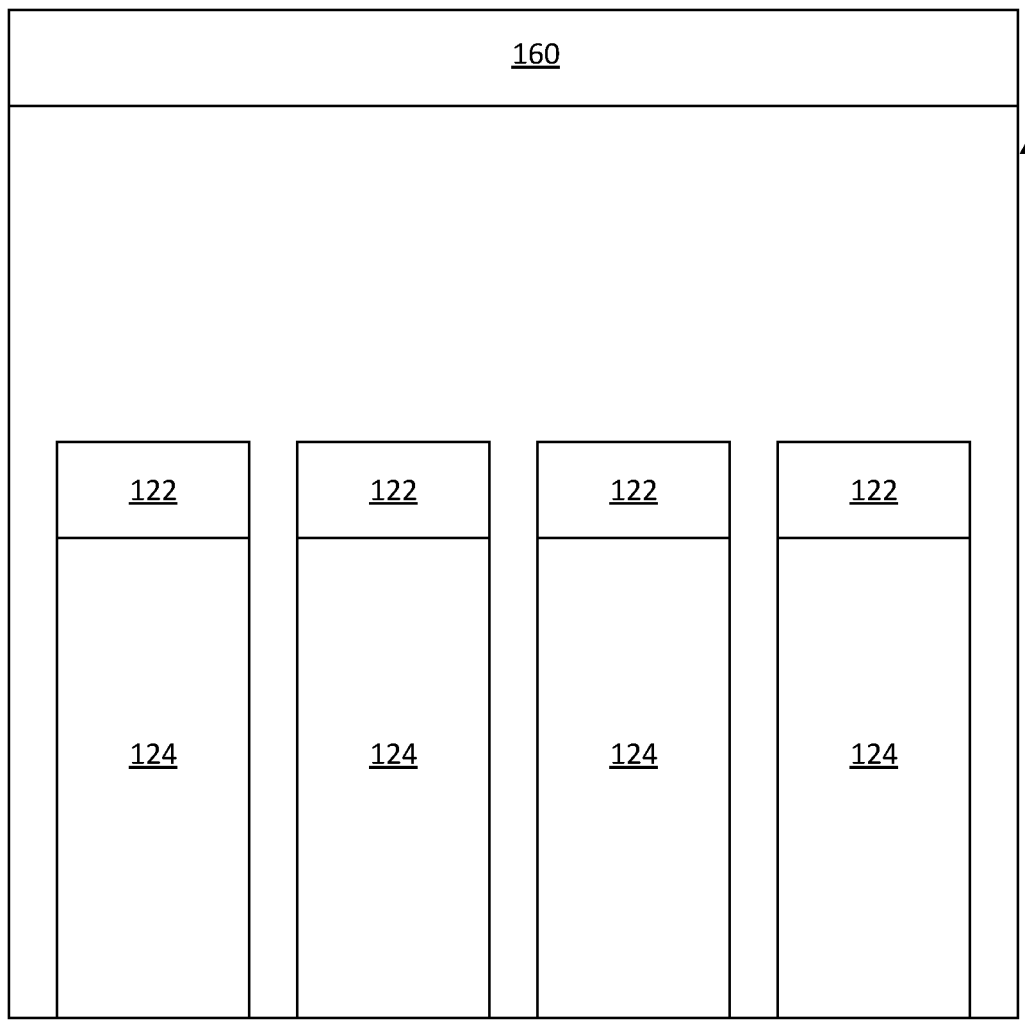
FIG. 1C is a front schematic view of an example electronic device manufacturing system, according to aspects of the present disclosure.

FIGS. 1A-1C describe an electronic device manufacturing system 100 where one or more load ports are coupled to a factory interface 106. FIG. 1A is a top schematic view of the example electronic device manufacturing system 100, according to aspects of the present disclosure. FIG. 1B is a side schematic view of the example electronic device manufacturing system 100, according to aspects of the present disclosure. FIG. 1C is a front schematic view of the example electronic device manufacturing system 100, according to aspects of the present disclosure. It is noted that FIGS. 1A-1C are used for illustrative purposes, and that different component can be positioned in different location in relation to each view.

Electronic device manufacturing system 100 (also referred to as an electronics processing system) is configured to perform one or more processes on a substrate 102. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Electronic device manufacturing system 100 includes a process tool (e.g., a mainframe) 104 and a factory interface 106 (e.g., an EFEM) coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms where each arm includes one or more end effectors at the end of each arm. The end effector can be configured to handle particular objects, such as wafers. Alternatively, or additionally, the end effector is configured to handle objects such as process kit rings. In some embodiments, transfer chamber robot 112 is a selective compliance assembly robot arm (SCARA) robot, such as a 2-link SCARA robot, a 3-link SCARA robot, a 4-link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to an at or near atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 is configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers (also referred to as containers) 122 and load lock 120. In other and/or similar embodiments, factory interface 106 is configured to receive replacement parts from replacement parts storage containers. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings. Any conventional robot type can be used for factory interface robot 126. Transfers can be carried out in any order or direction. Factory interface 106 can be maintained in, e.g., a slightly positive-pressure non-reactive gas environment (using, e.g., nitrogen, other inert gasses, or air with controlled sub-component parameters as the non-reactive gas) in some embodiments.

Factory interface 106 can be configured with any number of load ports 124, which can be located at one or more sides of the factory interface 106 and at the same or different elevations. One or more load ports 124 can include a load port door of a design that includes a seal having a base portion, a sealing portion, and/or a retaining portion as described herein. The seal and load port of such design will be discussed in greater detail with respect to FIGS. 2A-2C, 3A-3B, and 4A-4D.

Factory interface 106 can include one or more auxiliary components (not shown). The auxiliary components can include substrate storage containers, metrology equipment, servers, air conditioning units, etc. A substrate storage container can store substrates and/or substrate carriers (e.g., FOUPs), for example. Metrology equipment can be used to determine property data of the products that were produced by the electronic device manufacturing system 100. In some embodiments, factory interface 106 can include upper compartment 160, as seen in FIGS. 1B-1C. Upper compartment 160 can house electronic systems (e.g., servers, air conditioning units, etc.), utility cables, system controller 128, or other components.

In some embodiments, transfer chamber 110, process chambers 114, 116, and 118, and/or load lock 120 are maintained at a vacuum level. Electronics processing system 100 can include one or more vacuum ports that are coupled to one or more stations of electronic device manufacturing system 100. For example, first vacuum ports 130a can couple factory interface 106 to load locks 120. Second vacuum ports 130b can be coupled to load locks 120 and disposed between load locks 120 and transfer chamber 110.

Electronic device manufacturing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). System controller 128 can include an environmental controller configured to control an environment (e.g., pressure, moisture level, vacuum level, etc.) within factory interface 106. In embodiments, execution of the instructions by system controller 128 causes system controller to perform the methods of one or more of FIG. 5. System controller 128 can also be configured to permit entry and display of data, operating commands, and the like by a human operator.

Figure 2A:
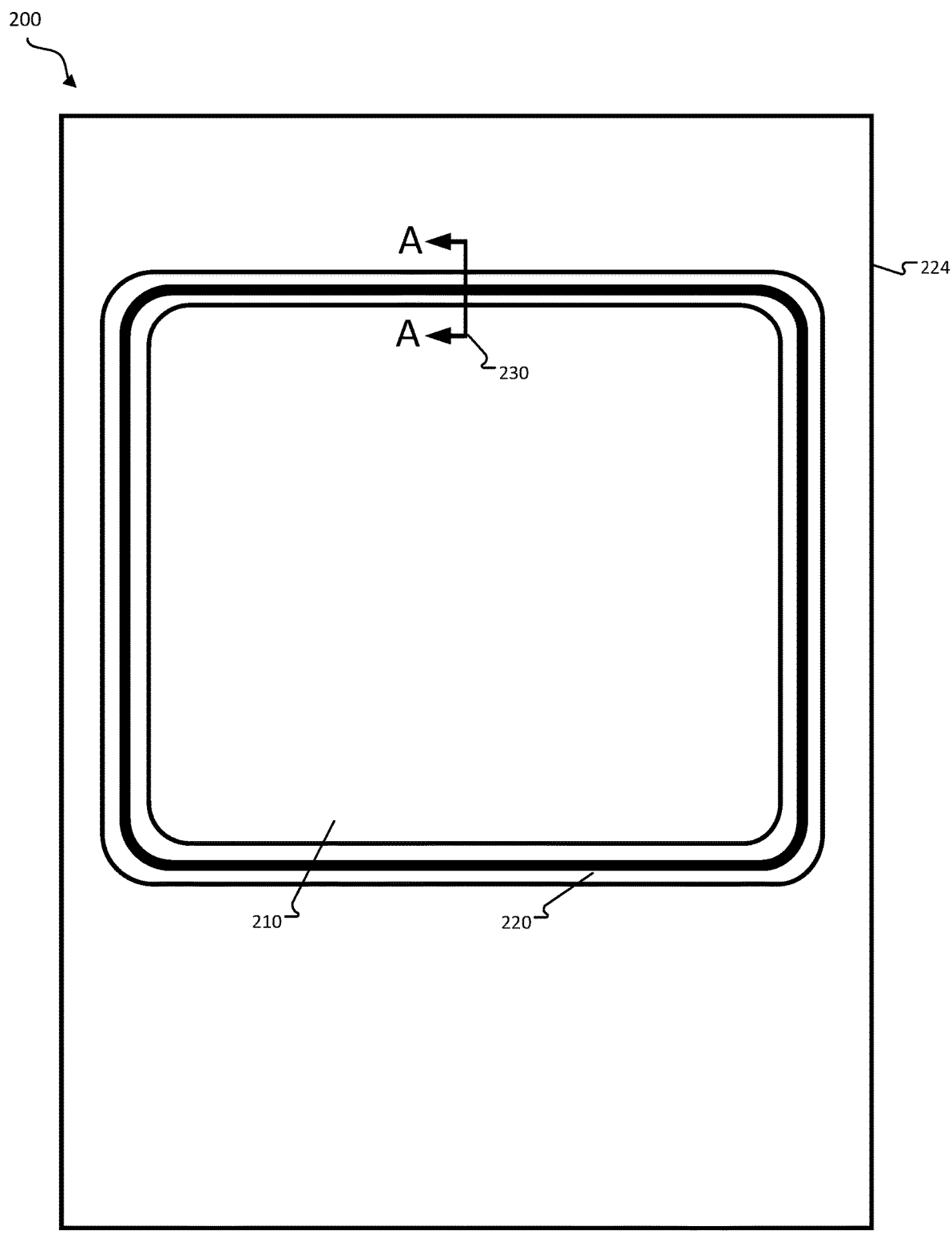
FIG. 2A is a front schematic view of an example load port frame and seal assembly, according to aspects of the present disclosure.
Figure 2C:
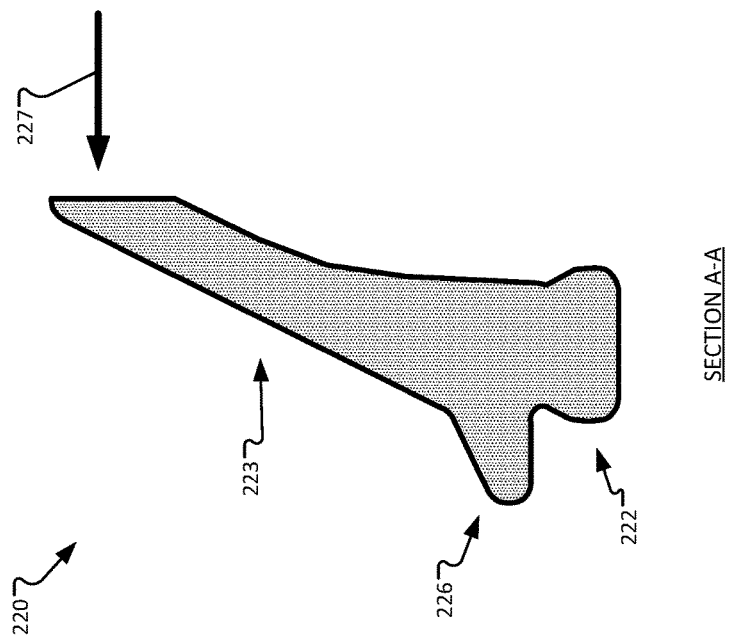
FIG. 2C is a cross section view of an example seal assembly, according to aspects of the present disclosure.
Figure 2B:
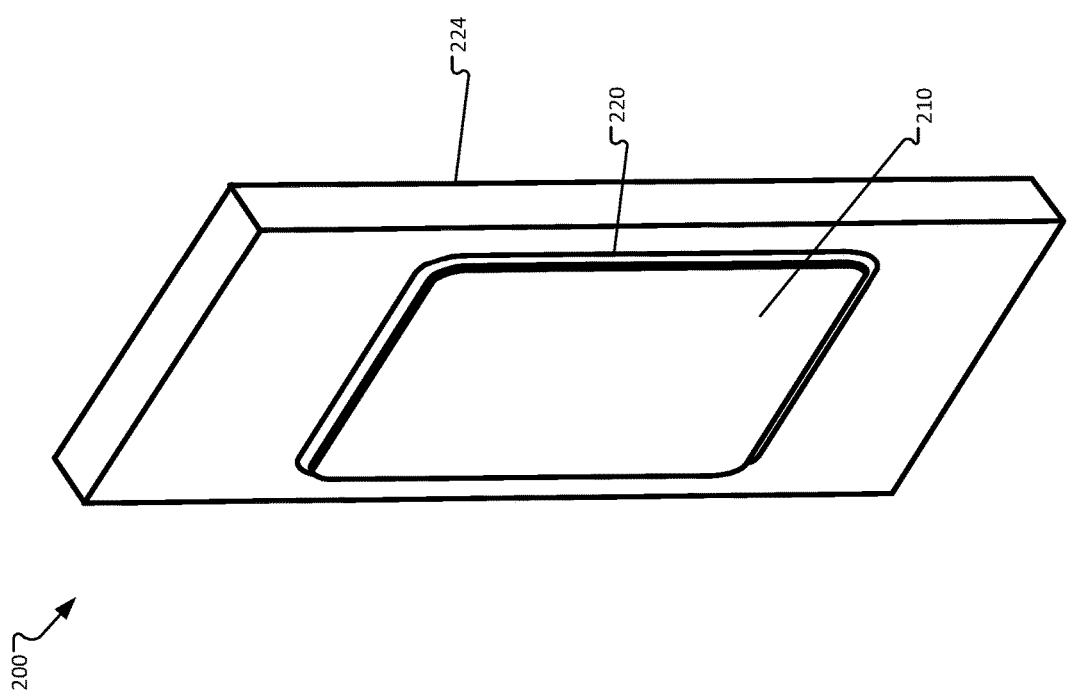
FIG. 2B is a perspective view of an example load port frame and seal assembly, according to aspects of the present disclosure.

FIGS. 2A-2C illustrate an example load port and seal assembly 200, in accordance with embodiments of the present disclosure. FIG. 2A is a front schematic view of load port and seal assembly 200, in accordance with embodiments of the present disclosure. FIG. 2B is a perspective view of load port and seal assembly 200, in accordance with embodiments of the present disclosure. FIG. 2C is a cross section view of seal 220 as indicated by section A-A 230. In some embodiments, the exterior of the load port frame 224 (or any other load port frame discussed herein) can comply with SEMI (Semiconductor Equipment and Materials International) standards and requirements.

A load port door 210 can be positioned in a closed position to secure to a transport opening to maintain an environmentally-controlled atmosphere in the factory interface 106. The load port door can be positioned in an open position using a door mechanism. While in the open position, the transport opening in the assembly 200 enables substrates (e.g., wafers) to be transferred between a substrate carrier 122 coupled to the load port 124 and factory interface 106 using factory interface robot 126.

Seal 220 can be positioned around the load port door 210. In some embodiments, the geometry of the seal is such that a base portion 222 of the seal couples to the load port door 210 and a surface of the sealing portion 223 extending from the base portion 222 contacts the surface (e.g., the sealing surface) of the load port frame 224 (responsive to the load port door being in the closed positon). In some embodiments, the sealing portion 223 may cantilever from the base portion 222. The seal 220 may create an airtight seal when the load port door 210 is in a closed position. In some examples, a surface of the sealing portion 223 proximate a distal end of the seal 220 engages with a sealing surface of the load port frame 224 to create an airtight seal. The base portion 222 may form a seal against the load port door 210. The load port door 210 may exert a force (e.g., a threshold sealing force) on the seal 220 and the load port frame 224 may exert a reaction force 227 on the sealing portion 223 of the seal 220 when the load port door 210 is in a closed position. In some embodiments, the load port door 210 moves to the closed position when the force is applied (e.g., by the door actuator). In some embodiments, the force (e.g., load) that is applied to the seal 220 during sealing (e.g., when the door is closed) is perpendicular to a surface at which the seal connects to the load port door (e.g., as shown in FIG. 2C). Such a perpendicular force can cause the seal to become disconnected from the load port door. In some embodiments, the seal 220 is configured to remain engaged with the load port door even under sealing conditions where a sealing force is perpendicular to a connection between the load port door and the seal.

In some embodiments, seal 220 is a single piece of material, such as, for example, vulcanized rubber or any other type of elastomer. Seal 220 may be composed of a flexible elastomer material. Those skilled in the art would understand that other suitable materials can be used, such as, for example, natural rubbers, silicone, plastics, other synthetic rubbers, polymers, expanded foam, etc. In some embodiments, seal 220 can be composed of multiple components coupled together. In some examples, the base portion 222 may be composed of a first material and the sealing portion 223 and the retaining portion 226 may be composed of a second material and may be bonded and/or coupled to the base portion 222. In some embodiments, at least a portion of the seal 220 is composed of a plastic material. In some embodiments, seal 220 is extruded or molded.

The retaining portion 226 of the seal 220 may be disposed proximate the base portion 222. In some embodiments, the retaining portion 226 is a protrusion that protrudes substantially perpendicular relative to the base portion 222. The retaining portion 226 may be disposed toward the distal end of the seal but proximate the base portion 222. The retaining portion 226 may include radiused corners. In some embodiments, the seal 220 includes a radiused corner between the retaining portion 226 and the base portion 222. In some embodiments, the seal 220 includes a radiused corner where the sealing portion 223 extends from the retaining portion 226. The retaining portion 226 may cause the seal to remain connected to the load port door under sealing conditions (e.g., a sealing force is applied to create an airtight seal). More details regarding the function of the retaining portion 226 are discussed with reference to FIG. 3A.

In some embodiments, the seal 220 may have a total height of between approximately 10 mm and 15 mm. The base portion 222 may have a height of between approximately 1.5 mm and 2.5 mm. In some embodiments, the seal 220 may have an un-flexed width (e.g., a width in a natural state) of between approximately 6 mm and 10 mm. The seal 220 may flex to a narrower width when a sealing force is applied (e.g., to the sealing portion 223). In some embodiments, the sealing portion 223 may have a width of between approximately 1 mm and 2 mm. In some embodiments, the sealing portion 223 is wider proximate the base portion 222 and narrower proximate a distal end. The sealing portion 223 may become gradually thinner at distances away from the base portion 222. In many embodiments, the base portion 222 is configured to fit into a conventional groove (e.g., a dovetail groove, a slotted groove, a square groove, etc.). Surfaces of the base portion 222 may have a radius to fit into a dovetail groove. In some embodiments, the base portion 222 may be configured to substantially fill a groove, but not completely fill the groove (e.g., see FIG. 3A). The base portion 222 may include radiused corners. The base portion 222 may have a width of between approximately 2.5 and 4 mm. In some embodiments, a neck of the base portion 222 (e.g., a narrow section of the base portion 222) may have a width of between approximately 2 mm and 3.5 mm. It is to be understood by a person of ordinary skill in the art that the seal 220 may have differing dimensions than described herein to fit certain applications.

Figure 3A:
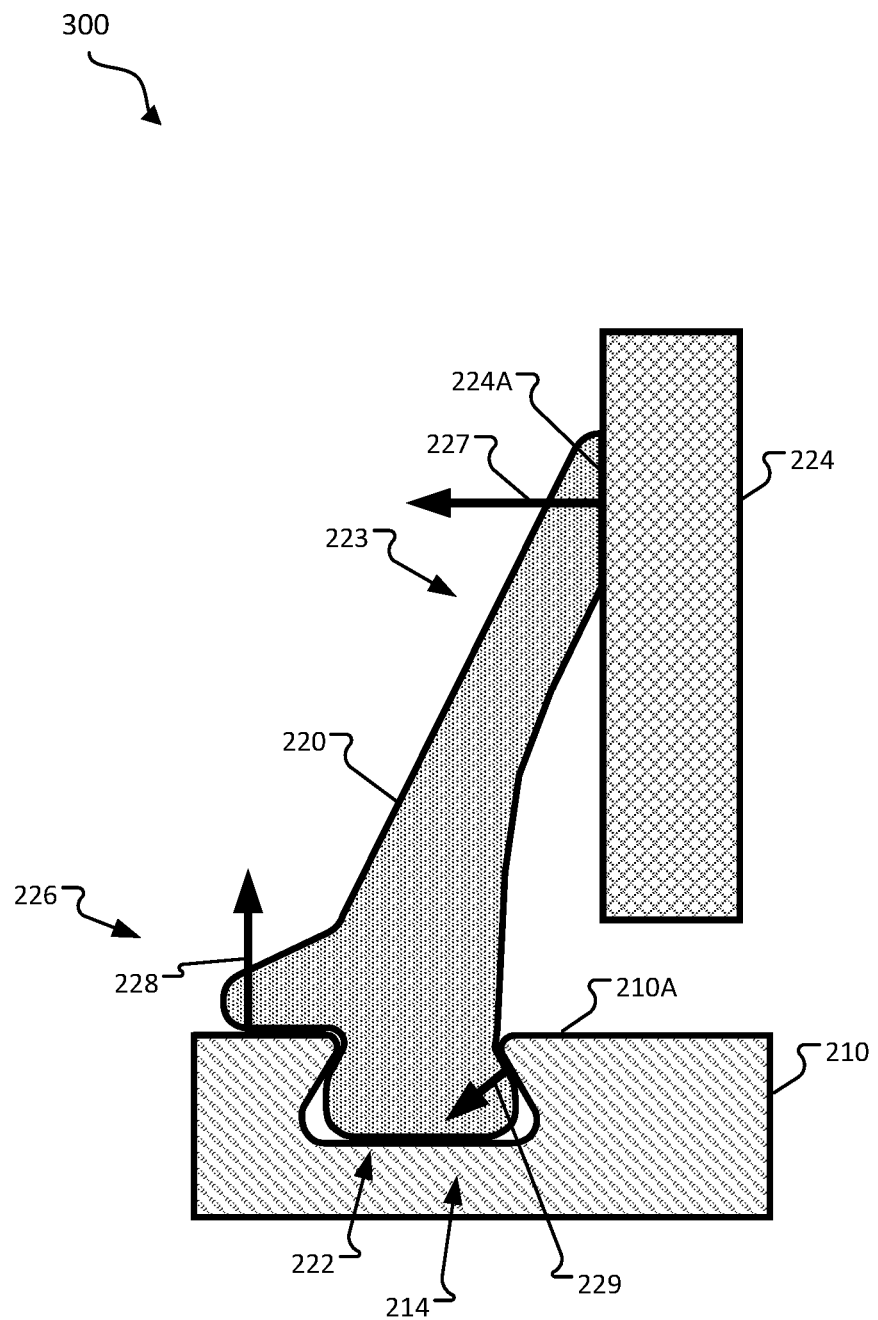
FIG. 3A is a cross section view of an example load port frame and seal assembly, according to aspects of the present disclosure.
Figure 3B:
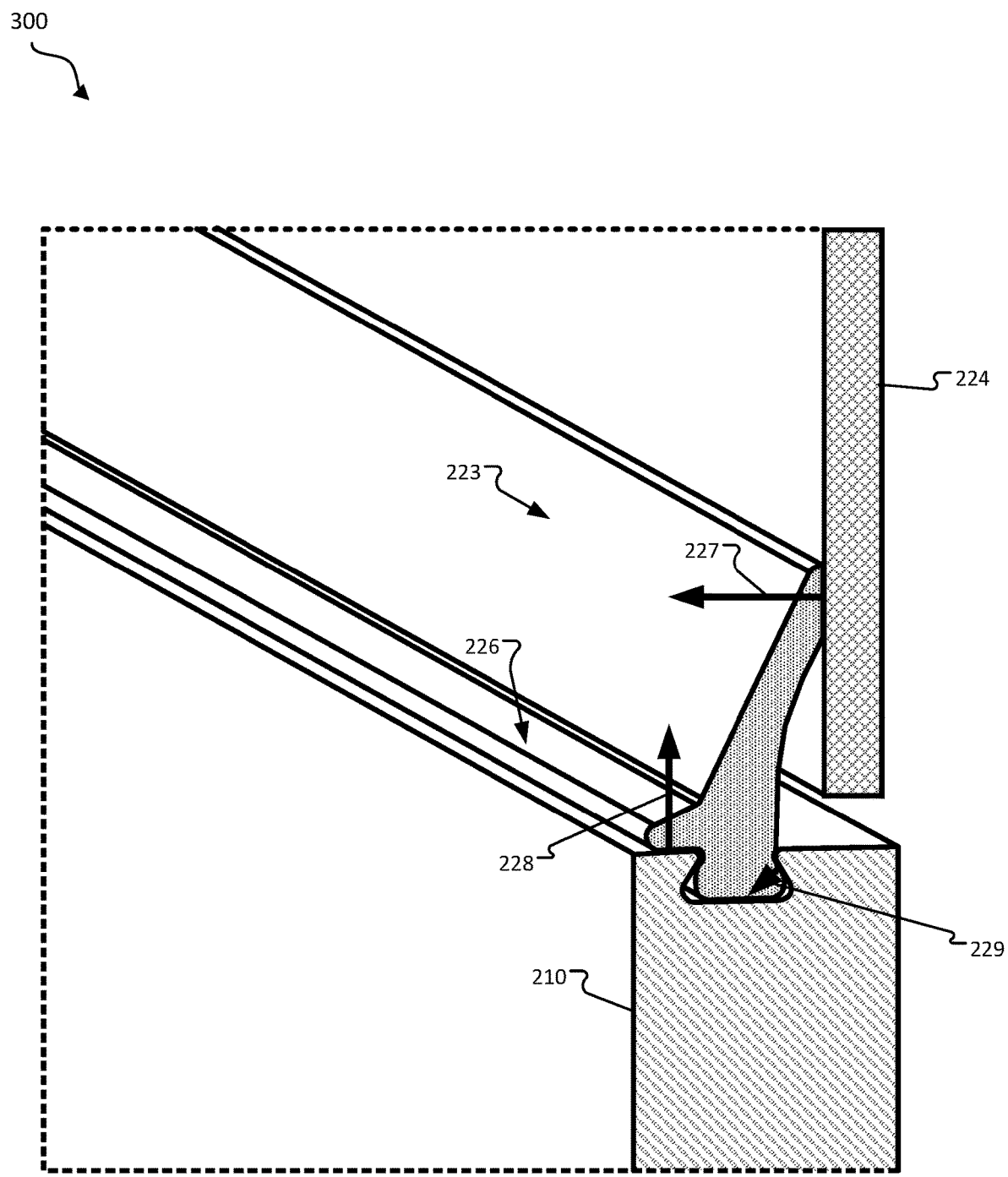
FIG. 3B is a perspective cross section view of an example load port frame and seal assembly, according to aspects of the present disclosure.

FIGS. 3A and 3B illustrate an example load port frame and seal assembly 300, according to aspects of the present disclosure. FIG. 3A is a cross section view of example load port frame and seal assembly 300. FIG. 3B is a perspective view of the assembly 300. The assembly 300 includes a first component (e.g., load port door 210), seal 220, and a second component (e.g., load port frame 224). As shown, load port door 210 is in a closed position with seal 220 creating an airtight seal between a sealing surface 224A of load port frame 224 and an edge surface 210A of the load port door 210.

In some embodiments, the edge surface 210A may be at an angle relative to the sealing surface 224A. As illustrated, the edge surface 210A is substantially perpendicular to the sealing surface 224A. The load port door 210 may be moveable relative to the load port frame 224. A door actuator (not illustrated) may move the load port door 210 between a closed position and an open position. The load port door 210 may be illustrated in a closed position. To move to an open position, the load port door 210 may move away from the load port frame 224 to the left (as illustrated) and then down (as illustrated) to clear the transport opening. The door actuator may apply a force on the load port door 210 to move the load port door 210 to a closed position. The sealing portion 223 of the seal 220 may push against the load port frame 224 responsive to the load port door 210 moving to the closed position. An airtight seal may be created by the seal 220 responsive to a threshold sealing force being applied against the sealing portion 223 (e.g., by the door actuator, by the load port frame 224, etc.).

The sealing surface 224A of the load port frame 224 may exert a reaction force 227 against a surface of the sealing component 223. The reaction force 227 may be normal to a plane of the sealing surface 224A and may be substantially equivalent to the threshold sealing force. The threshold sealing force may be applied substantially parallel to a plane of the edge surface 210A. In some embodiments, to create the airtight seal, the sealing force applied is between approximately 50 to 210 Newtons of force. In some embodiments, the sealing force applied is between approximately 70 and 130 Newtons. In some embodiments, the sealing force applied is less than a maximum force that can be applied to the load port door 210 by a door actuator (not illustrated). To create the airtight seal, a sealing force greater than a threshold sealing force may be applied. In some embodiments, at least a portion of the seal 220 may flex when the sealing force is applied. The airtight seal may inhibit the flow of fluid (e.g., gas, air, nitrogen, etc.) and contaminants (e.g., particles, etc.) between the interface of the load port door 210 and the load port frame 224.

In some embodiments, a portion of the edge surface 210A exerts a reaction force 228 against a surface of the retaining portion 226 of the seal 220. The reaction force 228 may be normal to the edge surface 210A. The reaction force 228 may be exerted responsive to a moment about an axis of the seal 220 created by the reaction force 227. The reaction force 228 may in turn cause reaction force 229 to be applied to a surface of the base portion 222 of the seal 220. In some embodiments, the reaction force 229 may cause the base portion 222 to be retained in the groove 214 of the load port door 210. In some embodiments, the base portion 222 may be retained in the groove 214 of the load port door 210 by the elastic properties of the seal 220. In some examples, the seal 220 is elastically stretched to fit around the load port door 210 and for the base portion 222 to sit in the groove 214. The elastic properties of the seal 220 may cause the base portion 222 to be retained in the groove 214. Groove 214 may be a dovetail groove, a half-dovetail groove, or a square groove. A downward vertical component (as illustrated) of the reaction force 229 on the base portion 222 may contribute to the base portion 222 remaining within the groove 214, thereby causing the seal 220 to remain coupled to the load port door 210 when the sealing force is applied against the sealing portion 223. In some embodiments, a deeper groove may aid in retaining the seal 220 in the groove 214. In many embodiments, the sum of the reaction forces 227, 228, 229, the sealing force applied to the sealing portion 223, and any moments about an axis of the seal 220 created by those forces is a net zero force and moment.

Figure 4A:
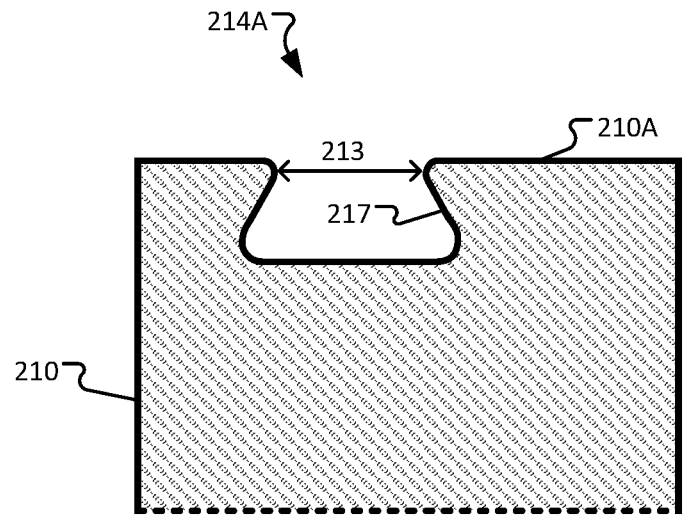
FIGS. 4A-4B are cross section views of an example load port door, according to aspects of the present disclosure.
Figure 4B:
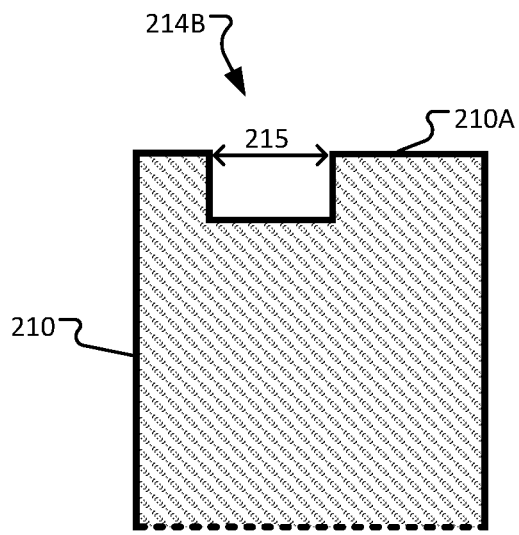
Figure 4C:
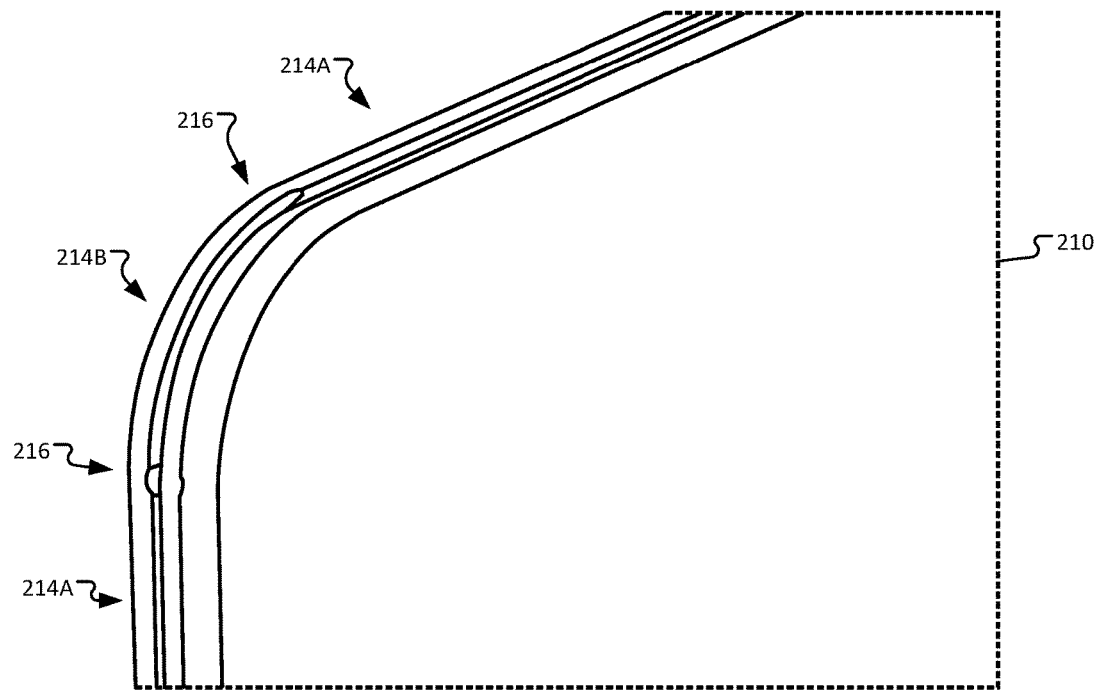
FIGS. 4C-4D are perspective views of an example load port door, according to aspects of the present disclosure.
Figure 4D:
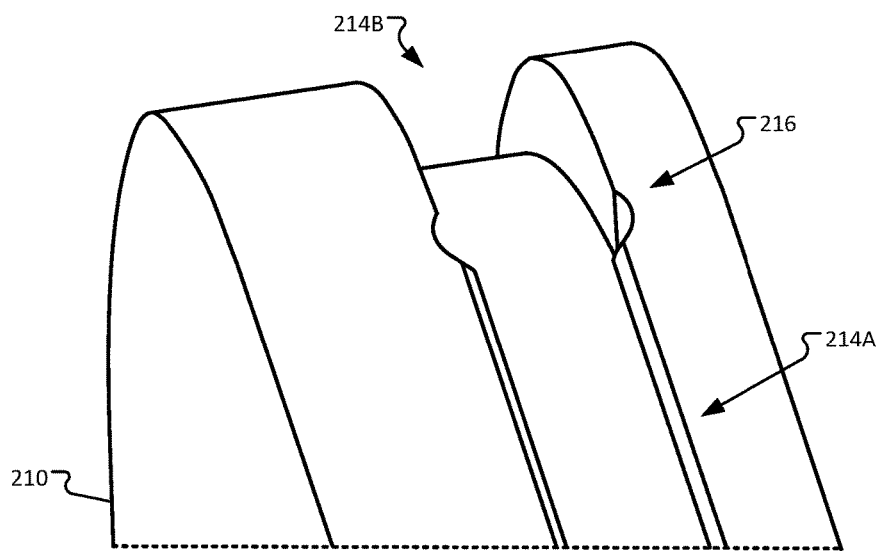

FIGS. 4A and 4B are cross section views of an example load port door 210, according to aspects of the present disclosure. FIGS. 4C and 4D are perspective views of an example load port door 210, according to aspects of the present disclosure. FIG. 4A shows a cross section of groove 214A. FIG. 4B shows a cross section of groove 214B.

In some embodiments, groove 214A is a dovetail groove formed in edge surface 210A. Groove 214A may be configured to accept base portion 222 of seal 220. In some embodiments, groove 214A may be an interface to couple the seal 220 to the load port door 210. Groove 214A may include two sidewalls 217 and a bottom wall.

In some embodiments, groove 214A may be cut (e.g., by a machining tool such as a milling cutter) along straight sections (e.g., straight portion, non-curved portion, etc.) of the perimeter of the load port door 210 (e.g., see FIGS. 4C and 4D). Groove 214A may be cut by a dovetail milling cutter. Because of the nature of dovetail milling cutters (e.g., wider at the bottom than at the top), a dovetail groove may not be cut on rounded profile (e.g., along a curved surface). Thus, in some embodiments, a rectangular groove 214B (e.g., substantially rectangular, square, non-dovetail, etc.) may be cut along curved sections (e.g., a curved portion, rounded corners, etc.) of the perimeter of the load port door 210 (e.g., see FIGS. 4C and 4D). In some examples, groove 214B may be cut on curved (e.g., rounded) sections of the edge surface 210A of the load port door 210. Groove 214B may be cut by a conventional milling cutter. In some embodiments, groove 214B is configured to accept the base portion 222 of the seal 220. In some embodiments, grooves 214A and 214B are configured to receive standard-sized o-rings common in the industry. A transition zone 216 may be included in the edge surface 210A where groove 214A meets groove 214B. The transition zone 216 may be a milling plunge zone where the dovetail milling cutter begins and/or ends cutting the dovetail groove 214A.

In some embodiments, grooves 214A and 214B have substantially the same depth. In some examples, grooves 214A and 214B have a depth of between approximately 1.5 mm and 2.5 mm. In some embodiments, the throat 213 of groove 214A may have a width of between approximately 2.2 mm and 3.5 mm. In some embodiments, the throat 215 of groove 214B may have a width of between approximately 3 mm and 4 mm. In some embodiments, the width of throat 215 is wider than the width of throat 213. In some embodiments, the maximum width of groove 214A is greater than a depth of the groove 214A. In some embodiments, a sidewall 217 of the dovetail groove 214A forms an angle with the edge surface 210A. In some examples, the sidewall 217 and the edge surface 210A form an angle of between approximately 45 and 80 degrees. In some examples, at least one sidewall forms an angle relative to the edge surface 210A. In some embodiments, the sidewalls of groove 214B are substantially perpendicular to the edge surface 210A. It is to be understood by a person of ordinary skill in the art that the grooves 214A and 214B may have differing dimensions than described herein to fit certain applications.

Figure 5:
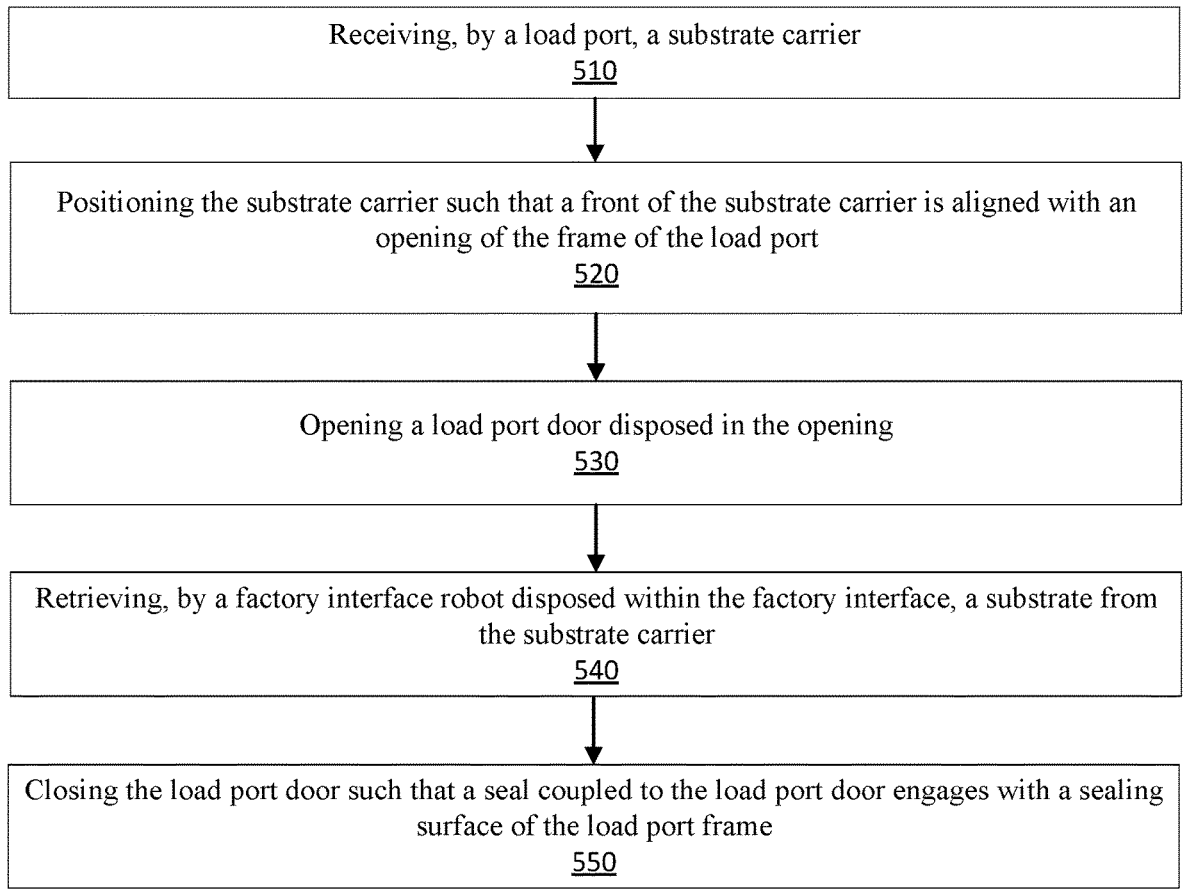
FIG. 5 is a flow chart of a method for transporting substrates from a substrate carrier to a factory interface, in accordance with embodiments of the present disclosure.

FIG. 5 is a flow chart of a method 500 for transporting substrates from a substrate carrier to a factory interface, in accordance with embodiments of the present disclosure. In some embodiments, method 500 is performed and/or caused to be performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 500 is performed, at least in part, by an electronic device manufacturing system (e.g., an electronic device manufacturing system 100 of FIGS. 1A-1C).

For simplicity of explanation, method 500 is depicted and described as a series of operations. However, operations in accordance with this disclosure can occur in various orders and/or concurrently and with other operations not presented and described herein. Furthermore, in some embodiments, not all illustrated operations are performed to implement method 500 in accordance with the disclosed subject matter. In addition, those skilled in the art will understand and appreciate that method 500 could alternatively be represented as a series of interrelated states via a state diagram or events.

At block 510, a load port receives a substrate carrier. In some examples, the substrate carrier is a FOUP. In some embodiments, the load port includes a frame adapted for connecting the load port to the factory interface. The frame includes a transport opening through which one or more substrates are capable of being transported between the substrate carrier and the factory interface. The load port also includes an actuator coupled to the frame and a load port door coupled to the actuator. The load port door can be configured to seal the transport opening. The actuator is capable of positioning the load port door from a closed position to an open position, and from the open position to the closed position.

The load port door can include one or more seals coupled to an edge surface of the load port door. A seal can include a base portion, a sealing portion extending from the base portion, and a retaining portion protruding substantially perpendicular to the base portion. The sealing portion may be configured to engage with a sealing surface of the load port frame when the load port door is in a closed position responsive to a threshold sealing force being applied against the sealing portion to create an airtight seal between the load port door and the load port frame. The base portion may be configured to couple to the load port door via a groove formed in the edge surface of the load port door.

At block 520, the substrate carrier can be positioned such that a front of the substrate carrier is aligned with an opening of the load port frame (e.g., a transport opening).

At block 530, the load port door disposed in the opening can be opened (e.g., via a door actuator). The load port door may be moved (e.g., by the door actuator) away from the opening so that the seal coupled to the load port door disengages from the sealing surface of the load port frame. The door may then be lowered away from the opening.

At block 540, a factory interface robot disposed within the factory interface may retrieve a substrate from the substrate carrier.

At block 550, once the substrates are retrieved, the load port door can be positioned from the open position to the closed position, using the actuator, such that the seal coupled to the load port door engages the sealing surface of the load port frame to form an airtight seal. The actuator may apply a sealing force on the load port door greater in magnitude than a threshold sealing force so that the seal can create the airtight seal between the load port door and the load port frame.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A seal comprising:
   a base portion configured to couple to a groove formed by an edge surface of a first component;
   a sealing portion extending from the base portion, wherein the sealing portion is configured to create an airtight seal between the first component and a sealing surface of a second component responsive to a threshold sealing force being applied against the sealing portion; and
   a retaining portion substantially perpendicular to the base portion, wherein a surface of the retaining portion is configured to push against the edge surface of the first component responsive to the threshold sealing force being applied against the sealing portion.

2. The seal of claim 1, wherein the edge surface of the first component is substantially perpendicular relative to the sealing surface of the second component, and wherein the first component is moveable relative to the second component.

3. The seal of claim 1, wherein at least the sealing portion of the seal comprises a flexible elastomer material.

4. The seal of claim 1, wherein the first component is a load port door of a factory interface and the second component is a frame of a load port comprising an opening to receive the load port door, wherein the load port door moves to a closed position responsive to the threshold sealing force being applied against the sealing portion, and wherein the threshold sealing force is applied substantially parallel to a plane of the edge surface of the first component.

5. The seal of claim 1, wherein the threshold sealing force is approximately 50 to 210 Newtons.

6. The seal of claim 1, wherein the retaining portion is configured to create a moment about an axis of the seal responsive to the threshold sealing force being applied against the sealing portion, wherein the base portion is configured such that a reaction force on a surface of the base portion causes the base portion to be retained in the groove.

7. The seal of claim 1, wherein at least a portion of the groove formed by the edge surface of the first component is a dovetail groove having two sidewalls and a bottom wall, wherein a maximum width between the two sidewalls is greater than a depth of the dovetail groove, and wherein at least one sidewall forms an angle of approximately 45 to 80 degrees relative to the bottom wall.

8. A load port door comprising:
   an interior surface;
   an exterior surface;
   an edge surface comprising a groove formed in the edge surface; and
   a seal coupled to the groove, wherein the seal comprises:
      a base portion configured to couple to the groove;
      a sealing portion extending from the base portion, wherein the sealing portion is configured to create an airtight seal between the load port door and a sealing surface of a frame of a load port responsive to a threshold sealing force being applied against the sealing portion; and
      a retaining portion substantially perpendicular to the base portion, wherein a surface of the retaining portion is configured to push against the edge surface responsive to the threshold sealing force being applied against the sealing portion.

9. The load port door of claim 8, wherein the edge surface of the load port door is configured to be substantially perpendicular relative to the sealing surface of the frame of the load port, and wherein the load port door is configured to be moveable relative to the frame of the load port.

10. The load port door of claim 8, wherein at least the sealing portion of the seal comprises a flexible elastomer material.

11. The load port door of claim 8, wherein the threshold sealing force is approximately 50 to 210 Newtons, and wherein the threshold sealing force is applied substantially parallel to a plane of the edge surface.

12. The load port door of claim 8, wherein the retaining portion of the seal is configured to create a moment about an axis of the seal responsive to the threshold sealing force being applied against the sealing portion of the seal, wherein the base portion of the seal is configured such that a reaction force on a surface of the base portion of the seal causes the base portion to be retained in the groove.

13. The load port door of claim 8, wherein at least a portion of the groove is a dovetail groove having two sidewalls and a bottom wall, wherein a maximum width between the two sidewalls is greater than a depth of the dovetail groove, and wherein at least one sidewall forms an angle of approximately 45 to 80 degrees relative to the bottom wall.

14. The load port door of claim 8, wherein the groove is formed in the edge surface along a perimeter of the load port door, wherein the groove is a dovetail groove along at least a straight portion of the edge surface, and wherein the groove is a substantially rectangular groove along at least a curved portion of the edge surface.

15. A load port for receiving a substrate carrier comprising:
   a frame adapted for connecting the load port to a factory interface, the frame comprising a transport opening through which one or more substrates are transportable between the substrate carrier and the factory interface;
   a load port door configured to substantially fill the transport opening, wherein the load port door comprises an edge surface forming a groove; and
   a seal coupled to the groove formed in the edge surface of the load port door, wherein the seal comprises:
      a base portion, wherein the seal is coupled to the groove of the load port door via the base portion;
      a sealing portion extending from the base portion, wherein the sealing portion is configured to create an airtight seal between the load port door and a sealing surface of the frame responsive to a threshold sealing force being applied against the sealing portion; and
      a retaining portion substantially perpendicular to the base portion, wherein a surface of the retaining portion is configured to push against the edge surface of the load port door responsive to the threshold sealing force being applied against the sealing portion.

16. The load port of claim 15, wherein the edge surface of the load port door is configured to be substantially perpendicular relative to the sealing surface of the frame, wherein the load port door is configured to be moveable relative to the frame of the load port, and wherein the seal is configured to engage with the sealing surface of the frame when the load port door is in a closed position.

17. The load port of claim 15, wherein the retaining portion of the seal is configured to create a moment about an axis of the seal responsive to the threshold sealing force being applied against the sealing portion of the seal, wherein the base portion of the seal is configured such that a reaction force on a surface of the base portion of the seal causes the base portion to be retained in the groove of the load port door.

18. The load port of claim 15, wherein at least a portion of the groove of the load port door is a dovetail groove having two sidewalls and a bottom wall, wherein a maximum width between the two sidewalls is greater than a depth of the dovetail groove, and wherein at least one sidewall forms an angle of approximately 45 to 80 degrees relative to the bottom wall.

19. The load port of claim 15, wherein the groove of the load port door is formed in the edge surface of the load port door along a perimeter of the load port door, wherein the groove is a dovetail groove along at least a straight portion of the edge surface of the load port door, and wherein the groove is a substantially rectangular groove along at least a curved portion of the edge surface of the load port door.

20. The load port of claim 15, wherein the threshold sealing force is approximately 50 to 210 Newtons, and wherein the threshold sealing force is applied substantially parallel to a plane of the edge surface of the load port door.

* * * * *